United States Patent
Sumino

(10) Patent No.: US 8,242,552 B2
(45) Date of Patent: Aug. 14, 2012

(54) STORAGE ELEMENT, METHOD OF MANUFACTURING SAME, AND SEMICONDUCTOR STORAGE DEVICE

(75) Inventor: Jun Sumino, Kanagawa (JP)

(73) Assignee: Sony Corporation, Tokyo (JP)

( * ) Notice: Subject to any disclaimer, the term of this patent is extended or adjusted under 35 U.S.C. 154(b) by 157 days.

(21) Appl. No.: 12/729,664

(22) Filed: Mar. 23, 2010

(65) Prior Publication Data

US 2010/0252798 A1 Oct. 7, 2010

(30) Foreign Application Priority Data

Apr. 2, 2009 (JP) .................................. 2009-089788

(51) Int. Cl.
*H01L 47/00* (2006.01)
*H01L 29/79* (2006.01)
*H01L 21/20* (2006.01)

(52) U.S. Cl. .................... 257/314; 257/4; 257/E27.103; 257/E21.003; 257/E45.002; 438/382

(58) Field of Classification Search .................... None
See application file for complete search history.

(56) References Cited

U.S. PATENT DOCUMENTS

2008/0123397 A1* 5/2008 Liu .............................. 365/163

FOREIGN PATENT DOCUMENTS

| JP | 2007-180473 | 7/2007 |
| JP | 2007-180474 | 7/2007 |

* cited by examiner

*Primary Examiner* — Ha Tran T Nguyen
*Assistant Examiner* — Valerie N Brown
(74) *Attorney, Agent, or Firm* — SNR Denton US LLP

(57) ABSTRACT

Disclosed herein is a storage element including: a first electrode; a second electrode formed in a position opposed to the first electrode; and a variable-resistance layer formed so as to be interposed between the first electrode and the second electrode. The first electrode is a tubular object, and is formed so as to be thicker on an opposite side from the variable-resistance layer than on a side of the variable-resistance layer.

16 Claims, 12 Drawing Sheets

STORAGE ELEMENT, METHOD OF MANUFACTURING SAME, AND SEMICONDUCTOR STORAGE DEVICE

BACKGROUND OF THE INVENTION

1. Field of the Invention

The present invention relates to a storage element, a method of manufacturing the same, and a semiconductor storage device.

2. Description of the Related Art

Semiconductor devices including nonvolatile memory cells such as an EEPROM (Electrically Erasable and Programmable ROM), a flash memory and the like are now being used in various electronic devices. To improve reliability such as the number of times of rewriting, data retention resistance and the like of the semiconductor devices and to miniaturize the structure of the semiconductor devices are important challenges.

Resistance change type memories have recently been drawing attention because of advantages thereof from viewpoints of reliability and miniaturization over flash memory structures typified by a floating type already available on the market. The resistance change type memories include ARAM, RRAM, PCRAM, MRAM, Spin RAM and the like. These resistance change type memories are said to be suitable for higher performance and higher degrees of integration in combination of simple structure, high-speed rewriting performance, and multilevel techniques, and are thus drawing attention.

In a nonvolatile memory element of the above-described resistance change type, the smaller the area of contact of a lower electrode with a variable-resistance layer, the more current density is increased and the more an electric field can be concentrated. It is thereby possible to contribute to improvement in rewriting performance and stability of characteristic variations.

However, reduction of the area of contact of the lower electrode with the variable-resistance layer is limited by photolithography performance, which makes miniaturization difficult. In addition, a contact structure of a tungsten-embedded type used commonly and widely has a problem of occurrence of characteristic variations due to a seam (hole) occurring in a central part. Further, it is difficult to increase efficiency of radiation of heat generated when a resistance change is effected by passing a current.

As a reference example, for instance, a projecting electrode object in a line shape projecting from a lower electrode is formed on side walls on both sides of the lower electrode, and a variable-resistance layer (variable resistor) is formed on the upper part of the projecting electrode object. A resistance changing element having an upper electrode formed on the upper part of the variable-resistance layer is disclosed (see Japanese Patent Laid-Open No. 2007-180473, Japanese Patent Laid-Open No. 2007-180474, hereinafter referred to as Patent Documents 1 and 2, respectively, for example). The variable-resistance layer is formed by a method of oxidizing a part of the projecting electrode object, thus limiting choices of resistance material. In addition, because the variable-resistance layer is formed on the upper part of the projecting electrode object formed in a line shape, an electric field tends to concentrate at angular parts of the projecting electrode object as viewed in a plan view, and thus the electric field cannot be uniformly concentrated over the entire region of the part in contact with the variable-resistance layer. Therefore characteristic variations occur easily.

SUMMARY OF THE INVENTION

A problem to be solved is that the electric field cannot be uniformly concentrated over the entire region of the part of the lower electrode which part is in contact with the variable-resistance layer and thus characteristic variations occur easily.

It is desirable to eliminate characteristic variations by concentrating an electric field uniformly over the entire region of the part of the lower electrode which part is in contact with the variable-resistance layer.

According to an embodiment of the present invention, there is provided a storage element including: a first electrode; a second electrode formed in a position opposed to the first electrode; and a variable-resistance layer formed so as to be interposed between the first electrode and the second electrode. The first electrode is a tubular object, and is formed so as to be thicker on an opposite side from the variable-resistance layer than on a side of the variable-resistance layer.

In the storage element according to the above-described embodiment of the present invention, the first electrode is formed so as to be thicker on the opposite side from the variable-resistance layer than on the side of the variable-resistance layer. In other words, the variable-resistance layer side is formed so as to be thinner than the opposite side from the variable-resistance layer. Thus, an electric field is easily concentrated on the variable-resistance layer side of the first electrode. In addition, because the first electrode is formed as a tubular object, it is possible to uniformly raise current density and concentrate an electric field at the entire region of a part of the first electrode which part is in contact with the variable-resistance layer. Therefore, characteristic variations due to electric field concentration at angular parts can be eliminated. In addition, because the opposite side from the variable-resistance layer is formed so as to be thicker than the variable-resistance layer side, heat generated in the variable-resistance layer is easily radiated to the lower part of the first electrode. That is, a heat radiating property is improved.

According to an embodiment of the present invention, there is provided a method of manufacturing a storage element, the method including the steps of: forming a hole in an interlayer insulating film; forming an electrode forming film on an inner surface of the hole and a surface of the interlayer insulating film; forming a first electrode by etching back the electrode forming film and leaving the electrode forming film on a side wall of the hole such that the electrode forming film is thicker on a side of a bottom part of the hole than on a side of an opening part of the hole; embedding an insulating film in the hole; forming a variable-resistance layer connected to an upper part of the first electrode on the interlayer insulating film; and forming a second electrode on the variable-resistance layer.

In the method of manufacturing the storage element according to the above-described embodiment of the present invention, the first electrode is formed by etching back the electrode forming film and leaving the electrode forming film on the side wall of the hole such that the electrode forming film is thicker on the side of the bottom part of the hole than on the side of the opening part of the hole. In other words, the first electrode is formed so as to be thinner on the side of the opening part of the hole than on the side of the bottom part of the hole. Thus, the variable-resistance layer side of the first electrode is formed in a shape that facilitates concentration of an electric field. In addition, because the first electrode is formed as a tubular object, an electric field can be uniformly concentrated at the entire region of an upper surface part of the first electrode which part is in contact with the variable-resistance layer. Therefore, characteristic variations due to electric field concentration at angular parts can be eliminated. In addition, because the first electrode is formed by leaving the electrode forming film such that the electrode forming film is thicker on the side of the bottom part of the hole than on the side of the opening part of the hole, heat generated in the variable-resistance layer is easily radiated to the lower part side of the first electrode. That is, a heat radiating property is improved.

According to an embodiment of the present invention, there is provided a semiconductor storage device including: a select transistor composed of an insulated gate field effect transistor formed on a semiconductor substrate; an interlayer insulating film covering the select transistor formed on the semiconductor substrate; and a storage element formed on the interlayer insulating film. The storage element includes a first electrode formed on the interlayer insulating film, a second electrode formed in a position opposed to the first electrode, and a variable-resistance layer formed so as to be interposed between the first electrode and the second electrode. The first electrode is a tubular object and is formed so as to be thicker on an opposite side from the variable-resistance layer than on a side of the variable-resistance layer. Also, one of diffusion layers formed in the semiconductor substrate on both sides of a gate electrode of the select transistor is connected to the first electrode.

The semiconductor storage device according to the above-described embodiment of the present invention uses the storage element according to the above-described embodiment of the present invention, so that rewriting is stable and rewriting speed is improved.

The storage element according to the above-described embodiment of the present invention can uniformly increase current density and concentrate an electric field at the entire region of a part of the first electrode which part is in contact with the variable-resistance layer. The storage element thus has an advantage of being able to perform data rewriting stably and achieve performance improvement in rewriting speed. In addition, heat generated in the variable-resistance layer is radiated to the lower part side of the first electrode, and therefore element degradation due to heat can be suppressed. Thus, the storage element has an advantage of being able to improve the number of times of rewriting and data retention reliability.

The method of manufacturing the storage element according to the above-described embodiment of the present invention can uniformly increase current density and concentrate an electric field at the entire region of a part of the first electrode which part is in contact with the variable-resistance layer. The manufacturing method thus has an advantage of making it possible to perform data rewriting stably and achieve performance improvement in rewriting speed. In addition, heat generated in the variable-resistance layer is radiated to the lower part side of the first electrode, and therefore element degradation due to heat can be suppressed. Thus, the manufacturing method has an advantage of being able to improve the number of times of rewriting and data retention reliability.

The semiconductor storage device according to the above-described embodiment of the present invention stabilizes rewriting and improves rewriting speed. The semiconductor storage device thus has an advantage of being able to improve reliability and improve operating speed.

DETAILED DESCRIPTION OF THE PREFERRED EMBODIMENTS

The mode for carrying out the invention (hereinafter referred to as embodiments) will hereinafter be described.

1. First Embodiment

First Example of Constitution of Storage Element

A first example of configuration of a storage element according to a first embodiment of the present invention will be described with reference to a schematic configuration sectional view of FIG. 1.

Figure 1:
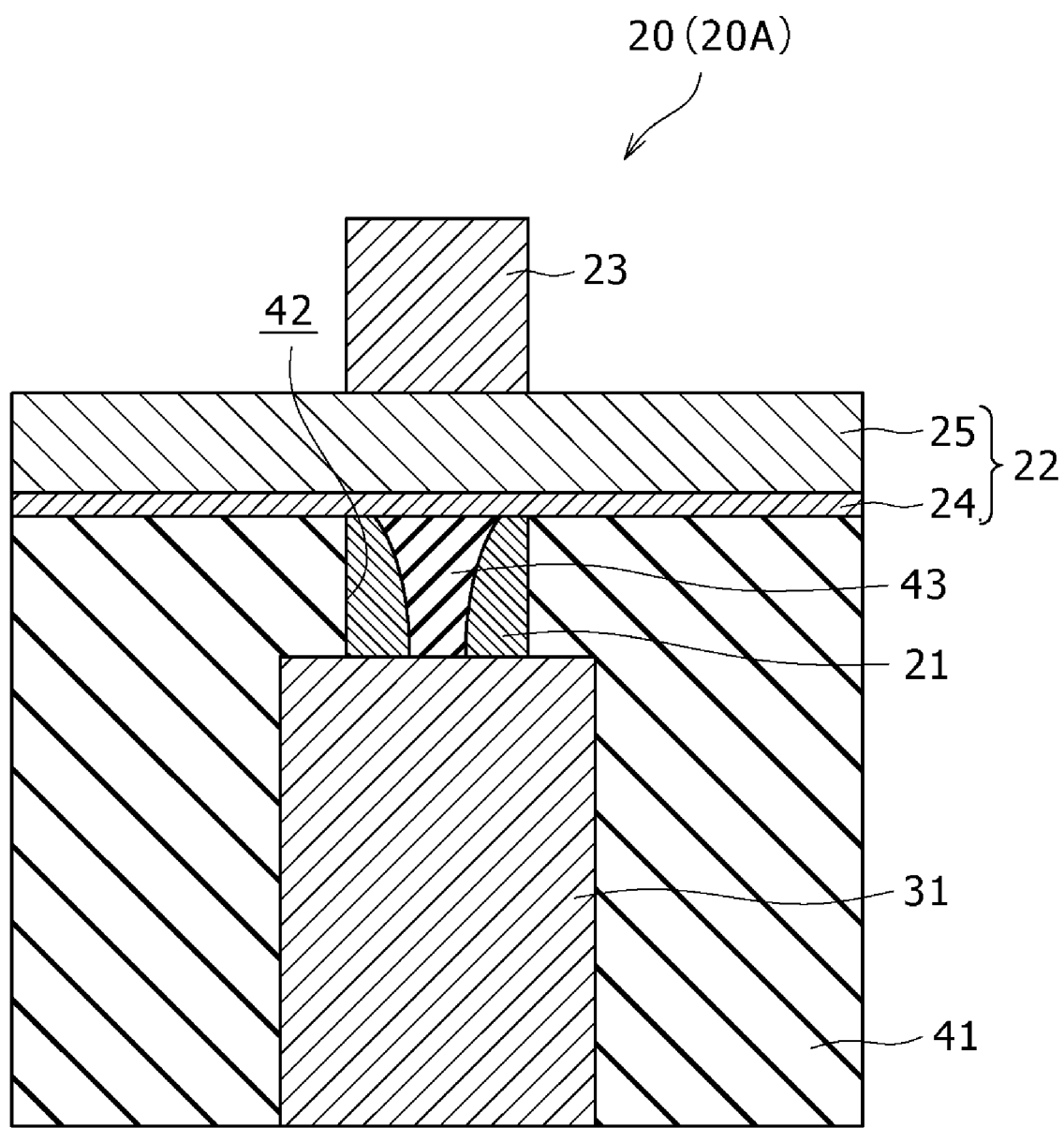
FIG. 1 is a schematic configuration sectional view of a first example of a storage element according to a first embodiment of the present invention.

As shown in FIG. 1, a third electrode 31 is formed within an interlayer insulating film 41 on a substrate (not shown). For example tungsten nitride, titanium nitride, tungsten, titanium, gold, platinum, silver, ruthenium, tellurium or the like can be used for this third electrode 31.

The interlayer insulating film 41 is formed of a material used as an interlayer insulating film of an ordinary semiconductor device, for example. For example, a silicon oxide film, a low dielectric constant organic insulating film, a low dielectric constant inorganic insulating film or the like can be used.

A hole 42 communicating with the third electrode 31 is formed in the interlayer insulating film 41. A first electrode 21 is formed on the side wall of the hole 42. Thus, the bottom part of the first electrode 21 is connected to the upper surface of the third electrode 31. The third electrode 31 is formed such that the area of the upper surface of the third electrode 31 on a side in contact with the first electrode 21 is equal to or more than the area of the bottom part of the first electrode 21.

The first electrode 21 is a tubular object, and is formed so as to be thicker on an opposite side from a variable-resistance layer 22 to be described later than on the side of the variable-resistance layer 22. For example, the first electrode 21 is formed so as to become gradually thicker from the side of the variable-resistance layer 22 to the opposite side from the variable-resistance layer 22.

For example, it is most desirable that the first electrode 21 be formed in a circular ring shape as viewed in a plan view from the side of the variable-resistance layer 22. The first electrode 21 also may be formed in an elliptical ring shape. The first electrode 21 may also be a polygon as long as angular parts thereof are rounded so as to prevent electric field concentration at the angular parts.

The first electrode 21 is formed of a wiring material used in a semiconductor process, for example titanium, titanium nitride, tungsten, tungsten nitride, copper, or a silicon base semiconductor material. Alternatively, aluminum, molybdenum, tantalum nitride tantalum, metal silicide and the like can be used. The silicon base semiconductor material includes single crystal silicon, polycrystalline silicon, amorphous silicon and the like. In addition, these silicon materials may include a conductive impurity such as arsenic, phosphorus, antimony, boron, indium or the like.

Incidentally, when a material that may be diffused into the side of the interlayer insulating film 41 such as copper or the like is used in the first electrode 21, it is desirable to form a barrier metal layer (not shown) on the side of the interlayer insulating film 41.

Further, an insulating film 43 is embedded in the hole 42.

In the drawing, the upper surface of the interlayer insulating film 41, the upper surface of the first electrode 21, and the upper surface of the insulating film 43 are formed in an identical plane.

The variable-resistance layer 22 is provided on the upper surface of the interlayer insulating film 41, the upper surface of the first electrode 21, and the upper surface of the insulating film 43. Further, a second electrode 23 is formed on the variable-resistance layer 22.

The variable-resistance layer 22 is for example composed of a storage layer 24 formed of a metallic oxide on the side of the first electrode 21 and an ion source layer 25 formed on the storage layer 24 and supplying metal ions to the storage layer 24 or receiving metal ions supplied to the storage layer 24.

The storage layer 24 is formed of one of gadolinium oxide, tantalum oxide, niobium oxide, aluminum oxide, hafnium oxide, zirconium oxide, and mixed materials thereof.

The ion source layer 25 includes one element selected from copper, silver, and zinc and one element selected from chalcogenide elements of tellurium, sulfur, and selenium. For example, CuTe, GeSbTe, CuGeTe, AgGeTe, AgTe, ZnTe, ZnGeTe, CuS, CuGeS, CuSe, CuGeSe and the like are cited.

As the second electrode 23, for example tungsten nitride, titanium nitride, tungsten, titanium, gold, platinum, silver, ruthenium, tellurium or the like can be used.

The second electrode 23 may be of an electrode plug shape, of a wiring structure, or of a film structure as long as the second electrode 23 is electrically connected to the variable-resistance layer 22. In addition, the third electrode 31 may be of an electrode plug shape, of a wiring structure, or a diffusion layer formed in a silicon substrate, for example, as long as the third electrode 31 is electrically connected to the lower surface side of the above-described first electrode 21.

The storage element 20 (20A) is thus formed.

Operations of storing and erasing information by the storage element 20 will be described in the following.

First, for example a positive potential (+potential) is applied to the ion source layer 25, and thus a positive voltage is applied to the storage element 20 such that the first electrode 21 side is a negative side. Thereby, one of Cu, Ag, and Zn is ionized from the ion source layer 25, diffused into the storage layer 24, and combined with electrons and precipitated on the first electrode 21 side. Alternatively, one of Cu, Ag, and Zn remains within the storage layer 24 in a diffused state.

Then, a current path including a large amount of one of Cu, Ag, and Zn is formed within the storage layer 24, or a large number of defects caused by one of Cu, Ag, and Zn are formed within the storage layer 24. Thereby the resistance value of the storage layer 24 is lowered. Each layer other than the storage layer 24 originally has a low resistance value as compared with the resistance value of the storage layer 24 before recording. Thus, lowering the resistance value of the storage layer 24 can lower the resistance value of the storage element 20 as a whole.

Thereafter, when the positive voltage is removed to eliminate the voltage applied to the storage element 20, the resistance value is retained in a lowered state. Thereby information can be recorded. When the storage element 20 is used in a storage device recordable once, or a so-called PROM, recording is completed by the above-described recording process.

On the other hand, application to an erasable storage device, or a so-called RAM or EEPROM or the like may need an erasing process. In the erasing process, for example a negative potential (−potential) is applied to the ion source layer 25, and thus a negative voltage is applied to the storage element 20 such that the first electrode 21 side is a positive side. Thereby, Cu, Ag, or Zn constituting the current path formed within the storage layer 24 or an impurity level ionizes, moves within the storage layer 24, and returns to the ion source layer 25 side.

Then, the current path or defects formed by one of Cu, Ag, and Zn disappear from the inside of the storage layer 24, so that the resistance value of the storage layer 24 is raised. Each layer other than the storage layer 24 originally has a low resistance value. Thus, raising the resistance value of the storage layer 24 can raise the resistance value of the storage element 20 as a whole.

Thereafter, when the negative voltage is removed to eliminate the voltage applied to the storage element 20, the resistance value is retained in a raised state. Thereby the recorded information can be erased.

By repeating such processes, the recording (writing) of information and the erasure of the recorded information can be performed repeatedly in the storage element 20.

In the storage element 20A, the first electrode 21 is formed by a tubular object, and is formed so as to be thicker on the opposite side from the variable-resistance layer 22 than on the variable-resistance layer 22 side. In other words, the variable-resistance layer 22 side is formed so as to be thinner than the opposite side from the variable-resistance layer 22. Thus, an electric field is easily concentrated on the variable-resistance layer 22 side of the first electrode 21. In addition, because the first electrode 21 is formed as a tubular object, it is possible to uniformly raise current density and concentrate an electric field at the entire region of a part of the first electrode 21 which part is in contact with the variable-resistance layer 22. Therefore, characteristic variations due to electric field concentration at angular parts of the electrode as in the techniques in the past can be eliminated.

There is thus an advantage of being able to perform stable data rewriting and achieve performance improvement in rewriting speed.

In addition, because the opposite side from the variable-resistance layer 22 is formed so as to be thicker than the variable-resistance layer 22 side, heat generated in the variable-resistance layer 22 is easily radiated to the lower part of the first electrode 21. That is, the first electrode 21 increases in sectional area from the variable-resistance layer 22 side to the third electrode 31 side, and thus increases in heat capacity from the variable-resistance layer 22 side to the third electrode 31 side. Therefore a heat radiating property is improved. In addition, because the third electrode 31 is formed such that the area of the upper surface of the third electrode 31 on the side in contact with the first electrode 21 is equal to or more than the area of the bottom part of the first electrode 21, the heat of the first electrode 21 is allowed to escape to the third electrode 31 side easily. That is, the heat radiating property is enhanced.

Accordingly, because the heat generated in the variable-resistance layer 22 is radiated to the lower part side of the first electrode 21, element degradation due to heat can be suppressed. Thus, there is an advantage of being able to improve the number of times of rewriting and data retention reliability.

In addition, because the interlayer insulating film 41 and the insulating film 43 are formed on the inside and the side peripheral part of the first electrode 21, and the upper surface of the insulating film 43, the upper surface of the first electrode 21, and the upper surface of the interlayer insulating film 41 are formed in an identical plane, an area of contact between the upper part of the first electrode 21 and the variable-resistance layer 22 is reduced. Thus, it is possible to raise current density and concentrate an electric field at the upper part (variable-resistance layer 22 side) of the first electrode 21, and contribute to improvement in rewriting performance and stability of characteristic variations.

Second Example of Configuration of Storage Element

A second example of configuration of the storage element according to the first embodiment of the present invention will next be described with reference to a schematic configuration sectional view of FIG. 2.

Figure 2:
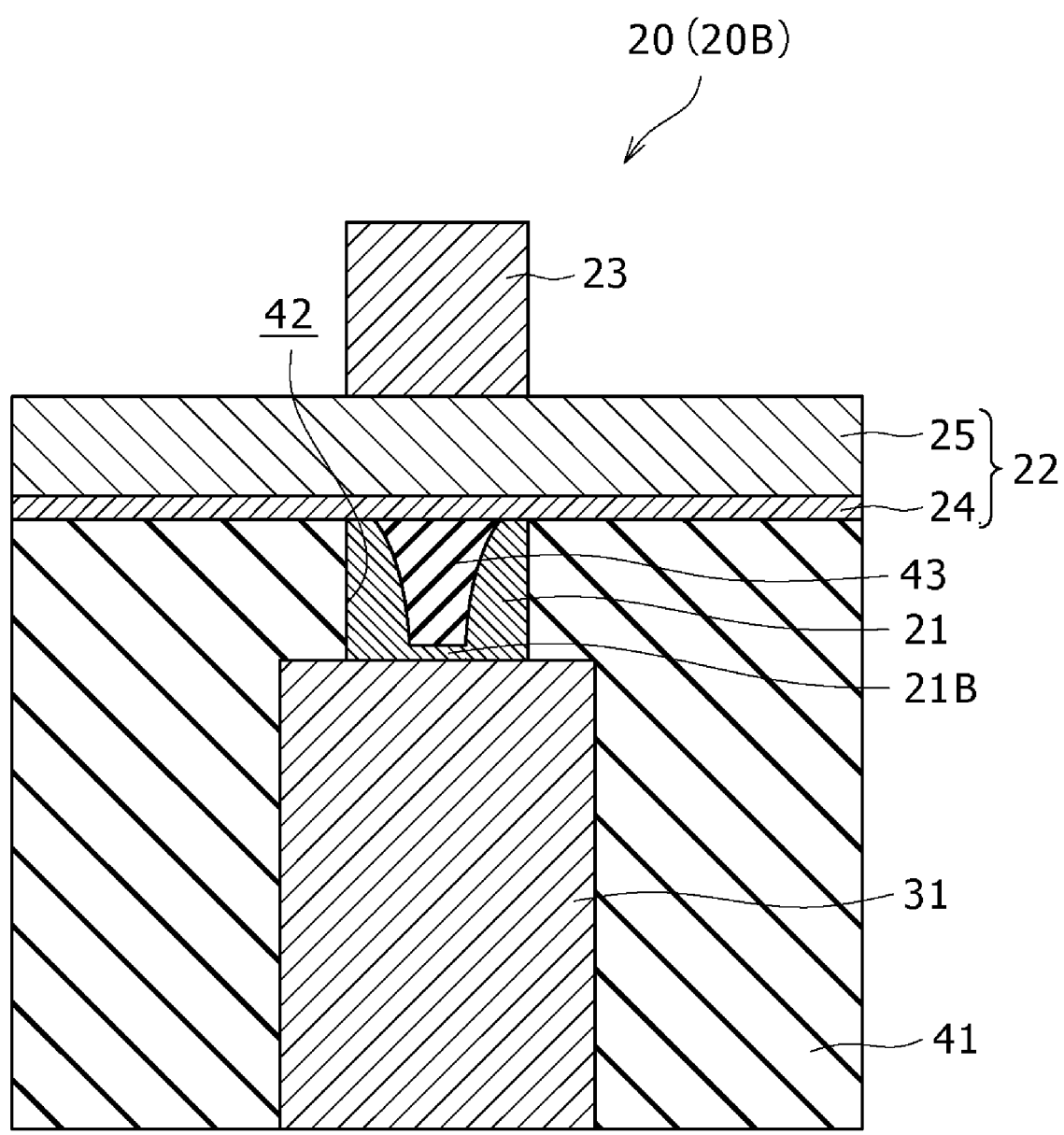
FIG. 2 is a schematic configuration sectional view of a second example of the storage element according to the first embodiment.

As shown in FIG. 2, a third electrode 31 is formed within an interlayer insulating film 41 on a substrate (not shown). For example tungsten nitride, titanium nitride, tungsten, titanium, gold, platinum, silver, ruthenium, tellurium or the like can be used for this third electrode 31.

The interlayer insulating film 41 is formed of a material used as an interlayer insulating film of an ordinary semiconductor device, for example. For example, a silicon oxide film, a low dielectric constant organic insulating film, a low dielectric constant inorganic insulating film or the like can be used.

A hole 42 communicating with the third electrode 31 is formed in the interlayer insulating film 41. A first electrode 21 is formed on the side wall of the hole 42. Thus, the bottom part of the first electrode 21 is connected to the upper surface of the third electrode 31. The third electrode 31 is formed such that the area of the upper surface of the third electrode 31 on a side in contact with the first electrode 21 is equal to or more than the area of the bottom part of the first electrode 21.

The first electrode 21 is a tubular object, and is formed so as to be thicker on an opposite side from a variable-resistance layer 22 to be described later than on the side of the variable-resistance layer 22. For example, the first electrode 21 is formed so as to become gradually thicker from the side of the variable-resistance layer 22 to the opposite side from the variable-resistance layer 22.

For example, it is most desirable that the first electrode 21 be formed in a circular ring shape as viewed in a plan view from the side of the variable-resistance layer 22. The first electrode 21 also may be formed in an elliptical ring shape. The first electrode 21 may also be a polygon as long as angular parts thereof are rounded so as to prevent electric field concentration at the angular parts.

In addition, the first electrode 21 has a bottom part electrode 21B connected to the first electrode 21 on the opposite side from the variable-resistance layer 22 (bottom part side of the hole 42). For example, the first electrode 21 and the bottom part electrode 21B are formed integrally with each other by a same material. The following description will be made supposing that the first electrode 21 includes the bottom part electrode 21B.

The first electrode 21 is formed of a wiring material used in a semiconductor process, for example titanium, titanium nitride, tungsten, tungsten nitride, copper, or a silicon base semiconductor material. Alternatively, aluminum, molybdenum, tantalum nitride tantalum, metal silicide and the like can be used. The silicon base semiconductor material includes single crystal silicon, polycrystalline silicon, amorphous silicon and the like. In addition, these silicon materials may include a conductive impurity such as arsenic, phosphorus, antimony, boron, indium or the like.

Incidentally, when a material that may be diffused into the side of the interlayer insulating film 41 such as copper or the like is used in the first electrode 21, it is desirable to form a barrier metal layer (not shown) on the side of the interlayer insulating film 41.

Further, an insulating film 43 is embedded in the hole 42.

In the drawing, the upper surface of the interlayer insulating film 41, the upper surface of the first electrode 21, and the upper surface of the insulating film 43 are formed in an identical plane.

The variable-resistance layer 22 is provided on the upper surface of the interlayer insulating film 41, the upper surface of the first electrode 21, and the upper surface of the insulating film 43. Further, a second electrode 23 is formed on the variable-resistance layer 22.

The variable-resistance layer 22 is for example composed of a storage layer 24 formed of a metallic oxide on the side of the first electrode 21 and an ion source layer 25 formed on the storage layer 24 and supplying metal ions to the storage layer 24 or receiving metal ions supplied to the storage layer 24.

The storage layer 24 is formed of one of gadolinium oxide, tantalum oxide, niobium oxide, aluminum oxide, hafnium oxide, zirconium oxide, and mixed materials thereof.

The ion source layer 25 includes one element selected from copper, silver, and zinc and one element selected from chalcogenide elements of tellurium, sulfur, and selenium. For example, CuTe, GeSbTe, CuGeTe, AgGeTe, AgTe, ZnTe, ZnGeTe, CuS, CuGeS, CuSe, CuGeSe and the like are cited.

As the second electrode 23, for example tungsten nitride, titanium nitride, tungsten, titanium, gold, platinum, silver, ruthenium, tellurium or the like can be used.

The second electrode 23 may be of an electrode plug shape, of a wiring structure, or of a film structure as long as the second electrode 23 is electrically connected to the variable-resistance layer 22. In addition, the third electrode 31 may be of an electrode plug shape, of a wiring structure, or a diffusion layer formed in a silicon substrate, for example, as long as the third electrode 31 is electrically connected to the lower surface side of the above-described first electrode 21.

The storage element 20 (20B) is thus formed.

Operations of storing and erasing information by the storage element 20B are the same as described above.

In the storage element 20B, the first electrode 21 is formed by a tubular object, and is formed so as to be thicker on the opposite side from the variable-resistance layer 22 than on the variable-resistance layer 22 side. In other words, the variable-resistance layer 22 side is formed so as to be thinner than the opposite side from the variable-resistance layer 22. Thus, an electric field is easily concentrated on the variable-resistance layer 22 side of the first electrode 21. In addition, because the first electrode 21 is formed as a tubular object, it is possible to uniformly raise current density and concentrate an electric field at the entire region of a part of the first electrode 21 which part is in contact with the variable-resistance layer 22. Therefore, characteristic variations due to electric field concentration at angular parts of the electrode as in the techniques in the past can be eliminated.

There is thus an advantage of being able to perform stable data rewriting and achieve performance improvement in rewriting speed.

In addition, because the opposite side from the variable-resistance layer 22 is formed so as to be thicker than the variable-resistance layer 22 side, and further the bottom part electrode 21B is formed, heat generated in the variable-resistance layer 22 is radiated to the lower part of the first electrode 21 more easily. That is, the first electrode 21 increases in sectional area from the variable-resistance layer 22 side to the third electrode 31 side, and thus increases in heat capacity from the variable-resistance layer 22 side to the third electrode 31 side. Therefore a heat radiating property is improved. In addition, because the third electrode 31 is formed such that the area of the upper surface of the third electrode 31 on the side in contact with the first electrode 21 is equal to or more than the area of the bottom part of the first electrode 21, the heat of the first electrode 21 is allowed to escape to the third electrode 31 side easily. That is, the heat radiating property is enhanced.

Accordingly, because the heat generated in the variable-resistance layer 22 is radiated to the lower part side of the first electrode 21, element degradation due to heat can be suppressed. Thus, there is an advantage of being able to improve the number of times of rewriting and data retention reliability.

In addition, because the interlayer insulating film 41 and the insulating film 43 are formed on the inside and the side peripheral part of the first electrode 21, and the upper surface of the insulating film 43, the upper surface of the first electrode 21, and the upper surface of the interlayer insulating film 41 are formed in an identical plane, an area of contact between the upper part of the first electrode 21 and the variable-resistance layer 22 is reduced. Thus, it is possible to raise current density and concentrate an electric field at the upper part (variable-resistance layer 22 side) of the first electrode 21, and contribute to improvement in rewriting performance and stability of characteristic variations.

Third Example of Configuration of Storage Element

A third example of configuration of the storage element according to the first embodiment of the present invention will next be described with reference to a schematic configuration sectional view of FIG. 3.

Figure 3:
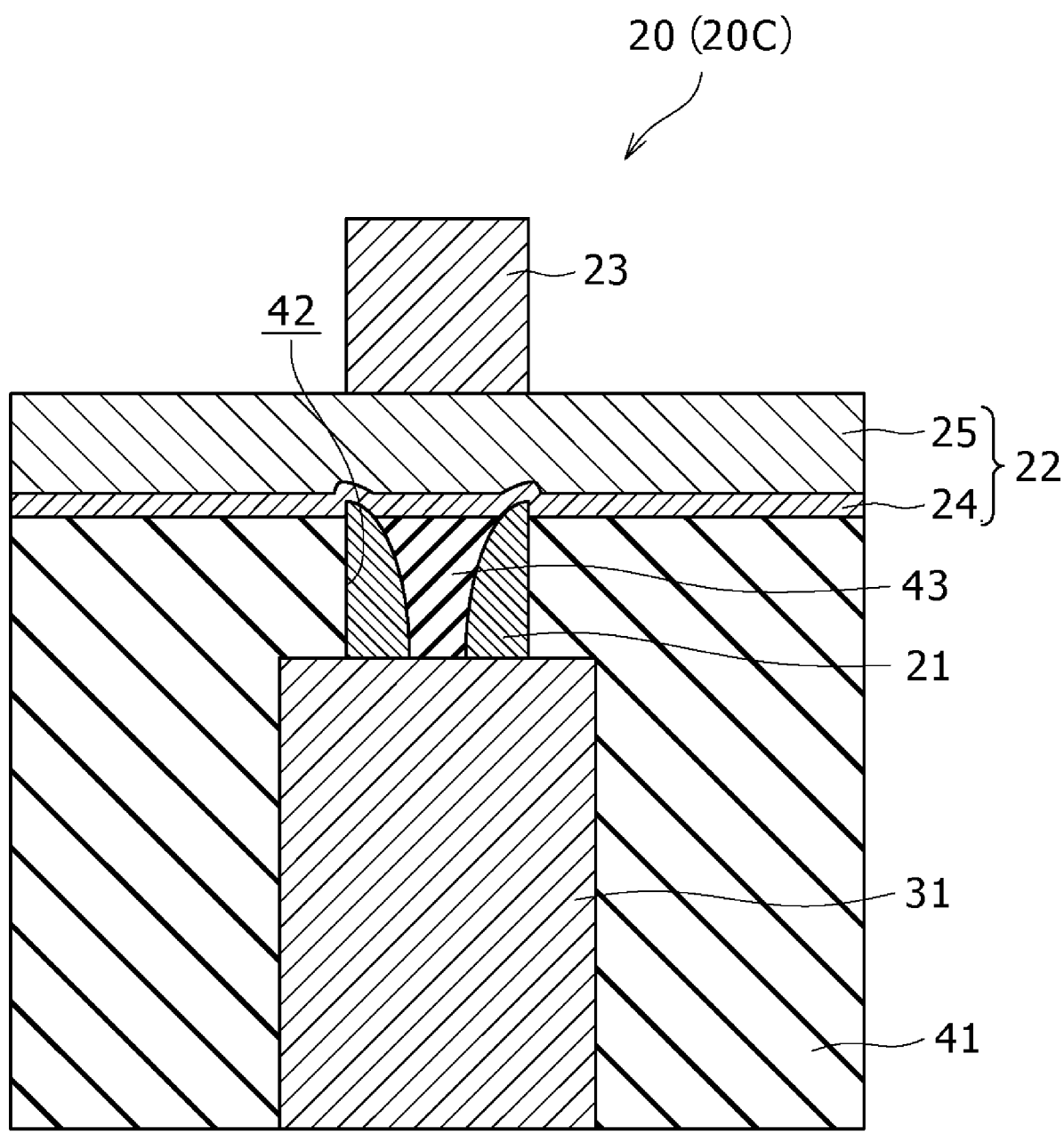
FIG. 3 is a schematic configuration sectional view of a third example of the storage element according to the first embodiment.

As shown in FIG. 3, a third electrode 31 is formed within an interlayer insulating film 41 on a substrate (not shown). An electrode material used in a semiconductor process, for example tungsten, tungsten nitride, titanium, titanium nitride, gold, platinum, silver, ruthenium, tellurium or the like can be used for this third electrode 31.

The interlayer insulating film 41 is formed of a material used as an interlayer insulating film of an ordinary semiconductor device, for example. For example, a silicon oxide film, a low dielectric constant organic insulating film, a low dielectric constant inorganic insulating film or the like can be used.

A hole 42 communicating with the third electrode 31 is formed in the interlayer insulating film 41. A first electrode 21 is formed on the side wall of the hole 42. Thus, the bottom part of the first electrode 21 is connected to the upper surface of the third electrode 31. The third electrode 31 is formed such that the area of the upper surface of the third electrode 31 on a side in contact with the first electrode 21 is equal to or more than the area of the bottom part of the first electrode 21.

The first electrode 21 is a tubular object, and is formed so as to be thicker on an opposite side from a variable-resistance layer 22 to be described later than on the side of the variable-resistance layer 22. For example, the first electrode 21 is formed so as to become gradually thicker from the side of the variable-resistance layer 22 to the opposite side from the variable-resistance layer 22.

For example, it is most desirable that the first electrode 21 be formed in a circular ring shape as viewed in a plan view from the side of the variable-resistance layer 22. The first electrode 21 also may be formed in an elliptical ring shape. The first electrode 21 may also be a polygon as long as angular parts thereof are rounded so as to prevent electric field concentration at the angular parts.

In addition, though not shown in FIG. 3, the first electrode 21 may have a bottom part electrode 21B (see FIG. 2 described above) on an opposite side from the variable-resistance layer as in the foregoing second example.

The first electrode 21 is formed of an electrode material used in a semiconductor process, for example titanium, titanium nitride, tungsten, tungsten nitride, copper, or a silicon base semiconductor material. Alternatively, aluminum, molybdenum, tantalum nitride tantalum, metal silicide and the like can be used. The silicon base semiconductor material includes single crystal silicon, polycrystalline silicon, amorphous silicon and the like. In addition, these silicon materials may include a conductive impurity such as arsenic, phosphorus, antimony, boron, indium or the like.

Incidentally, when a material that may be diffused into the side of the interlayer insulating film 41 such as copper or the like is used in the first electrode 21, it is desirable to form a barrier metal layer (not shown) on the side of the interlayer insulating film 41.

Further, an insulating film 43 is embedded in the hole 42.

In the drawing, the upper surface of the interlayer insulating film 41 and the upper surface of the insulating film 43 are formed in an identical plane, and the first electrode 21 is formed in a state of projecting from the identical plane.

The variable-resistance layer 22 is formed on the upper surface of the interlayer insulating film 41, the upper surface of the first electrode 21, and the upper surface of the insulating film 43. Further, a second electrode 23 is formed on the variable-resistance layer 22.

The variable-resistance layer 22 is for example composed of a storage layer 24 formed of a metallic oxide on the side of the first electrode 21 and an ion source layer 25 formed on the storage layer 24 and supplying metal ions to the storage layer 24 or receiving metal ions supplied to the storage layer 24.

The storage layer 24 is formed along the surface shape of the projected first electrode 21. The storage layer 24 is made of one of gadolinium oxide, tantalum oxide, niobium oxide, aluminum oxide, hafnium oxide, zirconium oxide, and mixed materials thereof.

The ion source layer 25 includes one element selected from copper, silver, and zinc and one element selected from chalcogenide elements of tellurium, sulfur, and selenium. For example, CuTe, GeSbTe, CuGeTe, AgGeTe, AgTe, ZnTe, ZnGeTe, CuS, CuGeS, CuSe, CuGeSe and the like are cited.

As the second electrode 23, for example tungsten nitride, titanium nitride, tungsten, titanium, gold, platinum, silver, ruthenium, tellurium or the like can be used.

The second electrode 23 may be of an electrode plug shape, of a wiring structure, or of a film structure as long as the second electrode 23 is electrically connected to the variable-resistance layer 22. In addition, the third electrode 31 may be of an electrode plug shape, of a wiring structure, or a diffusion layer formed in a silicon substrate, for example, as long as the third electrode 31 is electrically connected to the lower surface side of the above-described first electrode 21.

The storage element 20 (20C) is thus formed.

Operations of storing and erasing information by the storage element 20C are the same as described above.

In the storage element 20C, the first electrode 21 is formed by a tubular object, and is formed so as to be thicker on the opposite side from the variable-resistance layer 22 than on the variable-resistance layer 22 side. In other words, the variable-resistance layer 22 side is formed so as to be thinner than the opposite side from the variable-resistance layer 22. Thus, an electric field is easily concentrated on the variable-resistance layer 22 side of the first electrode 21. In addition, because the first electrode 21 is formed as a tubular object, it is possible to uniformly raise current density and concentrate an electric field at the entire region of a part of the first electrode 21 which part is in contact with the variable-resistance layer 22. Therefore, characteristic variations due to electric field concentration at angular parts of the electrode as in the techniques in the past can be eliminated.

There is thus an advantage of being able to perform stable data rewriting and achieve performance improvement in rewriting speed.

In addition, because the opposite side from the variable-resistance layer 22 is formed so as to be thicker than the variable-resistance layer 22 side, and further the bottom part electrode 21B is formed, heat generated in the variable-resistance layer 22 is radiated to the lower part of the first electrode 21 more easily. That is, the first electrode 21 increases in sectional area from the variable-resistance layer 22 side to the third electrode 31 side, and thus increases in heat capacity from the variable-resistance layer 22 side to the third electrode 31 side. Therefore a heat radiating property is improved. In addition, because the third electrode 31 is formed such that the area of the upper surface of the third electrode 31 on the side in contact with the first electrode 21 is equal to or more than the area of the bottom part of the first electrode 21, the heat of the first electrode 21 is allowed to escape to the third electrode 31 side easily. That is, the heat radiating property is enhanced.

Accordingly, because the heat generated in the variable-resistance layer 22 is radiated to the lower part side of the first electrode 21, element degradation due to heat can be suppressed. Thus, there is an advantage of being able to improve the number of times of rewriting and data retention reliability.

In addition, the insulating film 43 is formed, the upper surface of the insulating film 43 and the upper surface of the interlayer insulating film 41 are formed in an identical plane, and the first electrode 21 is formed in a state of projecting from the identical plane. Thereby, an area of contact between the upper part of the first electrode 21 and the variable-resistance layer 22 is somewhat increased, but an electric field is concentrated at the upper end part of the first electrode 21 more easily. It is thus possible to contribute to improvement in rewriting performance and stability of characteristic variations.

Incidentally, although the tip part (upper part) of the first electrode 21 is formed in a state of projecting from the surface of the interlayer insulating film 41, an applied voltage is about 3.0 V at a maximum, and thus the storage layer 24 formed by a thin film of metallic oxide in the variable-resistance layer 22 formed over the upper part of the first electrode 21 does not cause a dielectric breakdown.

Fourth Example of Constitution of Storage Element

A fourth example of configuration of a storage element according to the first embodiment of the present invention will be described with reference to a schematic configuration sectional view of FIG. 4.

Figure 4:
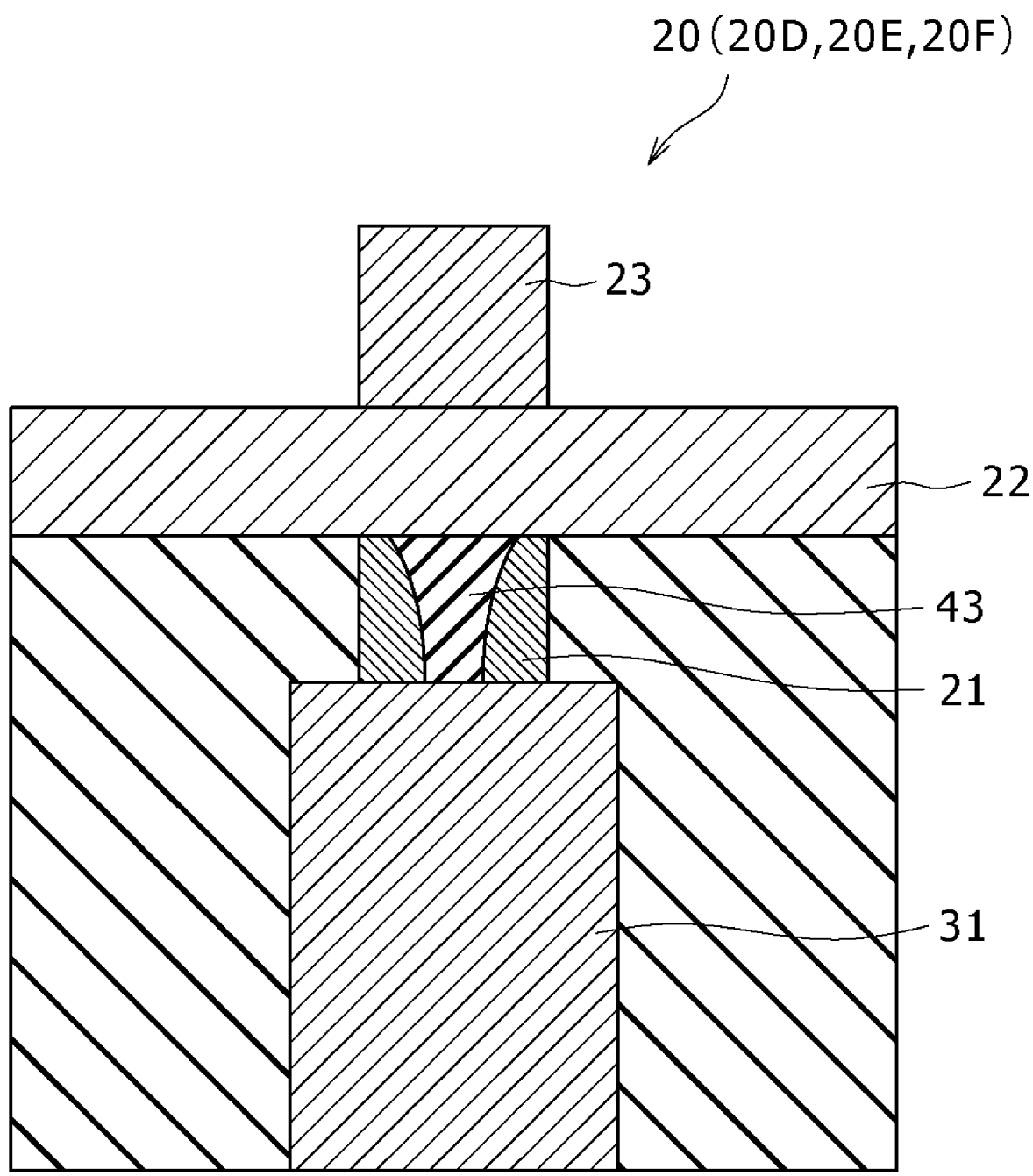
FIG. 4 is a schematic configuration sectional view of a fourth to a sixth example of the storage element according to the first embodiment.

As shown in FIG. 4, a storage element 20 (20D) in the fourth example has a different variable-resistance layer 22 from that of the first to third examples described above, and otherwise has a same configuration as in the first to third examples. Description will be made in the following of for example a case where the variable-resistance layer 22 is different in the first example.

The variable-resistance layer 22 is made of a metallic oxide film. For example, the variable-resistance layer 22 is made of nickel oxide, and is formed between a first electrode 21 and a second electrode 23 made of platinum. Alternatively, the variable-resistance layer 22 is made of a metallic oxide film of a double-layer structure having a titanium oxide film on the side of the first electrode 21 and having a Ti:Ni oxide film formed by adding titanium to nickel oxide on the side of the second electrode 23.

In addition, the variable-resistance layer 22 may be of a laminated structure of a cobalt oxide film and a tantalum oxide film. In this case, a tantalum electrode is used as an electrode on the side forming an anode.

Furthermore, an oxide of a transition metal element such as titanium oxide, zinc oxide, niobium oxide or the like can be used as the variable-resistance layer 22.

The variable-resistance layer 22 produces a difference in amount of current flowing through the variable-resistance layer 22 by using a change in resistance value of the variable-resistance layer 22 through application of voltage between the first electrode 21 and the second electrode 23. Storage and readout are performed by obtaining information of "0" and "1" using the difference in the amount of current.

The storage element 20 (20D) is thus formed.

As in the first to third examples described above, in the storage element 20D, an electric field is easily concentrated on the variable-resistance layer 22 side of the first electrode 21. In addition, because the first electrode 21 is formed as a tubular object, it is possible to uniformly raise current density and concentrate an electric field at the entire region of a part of the first electrode 21 which part is in contact with the variable-resistance layer 22. Therefore, characteristic variations due to electric field concentration at angular parts of the electrode as in the techniques in the past can be eliminated.

There is thus an advantage of being able to perform stable data rewriting and achieve performance improvement in rewriting speed.

In addition, as in the first to third examples described above, heat generated in the variable-resistance layer 22 is radiated to the lower part of the first electrode 21 more easily.

That is, the first electrode 21 increases in heat capacity from the variable-resistance layer 22 side to the third electrode 31 side. Therefore a heat radiating property is improved. In addition, as in the first to third examples described above, the heat of the first electrode 21 is allowed to escape to the third electrode 31 side easily. That is, the heat radiating property is enhanced.

Accordingly, because the heat generated in the variable-resistance layer 22 is radiated to the lower part side of the first electrode 21, element degradation due to heat can be suppressed. Thus, there is an advantage of being able to improve the number of times of rewriting and data retention reliability.

Fifth Example of Constitution of Storage Element

A fifth example of configuration of a storage element according to the first embodiment of the present invention will be described with reference to a schematic configuration sectional view of FIG. 4 described above.

As shown in FIG. 4 described above, a storage element 20 (20E) in the fifth example has a different variable-resistance layer 22 from that of the first to third examples described above, and otherwise has a same configuration as in the first to third examples. Description will be made in the following of for example a case where the variable-resistance layer 22 is different in the first example.

The variable-resistance layer 22 is for example formed by a solid electrolyte membrane. The solid electrolyte membrane includes solid electrolyte membranes having one or both of silver (Ag) and copper (Cu) and solid electrolyte membranes having one or both of germanium sulfide (GeS) and germanium selenide (GeSe).

When a voltage is applied to the variable-resistance layer 22, copper or silver in the solid electrolyte membrane moves. The variable-resistance layer 22 creates a difference in amount of current flowing in the solid electrolyte membrane by using a change in resistance value when copper or silver moves in a direction in which a negative voltage is applied, for example. Storage and readout are performed by obtaining information of "0" and "1" using the difference in the amount of current.

The second electrode 23 may be of an electrode plug shape, of a wiring structure, or of a film structure as long as the second electrode 23 is electrically connected to the variable-resistance layer 22. In addition, the third electrode 31 may be of an electrode plug shape, of a wiring structure, or a diffusion layer formed in a silicon substrate or the like, for example, as long as the third electrode 31 is electrically connected to the lower surface side of the above-described first electrode 21.

The storage element 20 (20E) is thus formed.

As in the first to third examples described above, in the storage element 20E, an electric field is easily concentrated on the variable-resistance layer 22 side of the first electrode 21. In addition, because the first electrode 21 is formed as a tubular object, it is possible to uniformly raise current density and concentrate an electric field at the entire region of a part of the first electrode 21 which part is in contact with the variable-resistance layer 22. Therefore, characteristic variations due to electric field concentration at angular parts of the electrode as in the techniques in the past can be eliminated.

There is thus an advantage of being able to perform stable data rewriting and achieve performance improvement in rewriting speed.

In addition, as in the first to third examples described above, heat generated in the variable-resistance layer 22 is radiated to the lower part of the first electrode 21 more easily. That is, the first electrode 21 increases in heat capacity from the variable-resistance layer 22 side to the third electrode 31 side. Therefore a heat radiating property is improved. In addition, as in the first to third examples described above, the heat of the first electrode 21 is allowed to escape to the third electrode 31 side easily. That is, the heat radiating property is enhanced.

Accordingly, because the heat generated in the variable-resistance layer 22 is radiated to the lower part side of the first electrode 21, element degradation due to heat can be suppressed. Thus, there is an advantage of being able to improve the number of times of rewriting and data retention reliability.

Sixth Example of Constitution of Storage Element

A sixth example of configuration of a storage element will be described with reference to a schematic configuration sectional view of FIG. 4 described above.

As shown in FIG. 4 described above, a storage element 20 (20F) in the sixth example has a different variable-resistance layer 22 from that of the first to third examples described above, and otherwise has a same configuration as in the first to third examples. Description will be made in the following of for example a case where the variable-resistance layer 22 is different in the first example.

The variable-resistance layer 22 is a so-called phase change layer that effects phase change through application of voltage. For example, phase change is effected in the variable-resistance layer 22 by applying a voltage to a second electrode 23, and a storing operation is performed using a change in resistance value due to the phase change. Germanium antimony telluride ($Ge_2Sb_2Te_5$) is used for the phase change layer, and for example titanium nitride is used for a first electrode 21 and the second electrode 23. In addition, oxygen may be added to the germanium antimony telluride of the phase change layer.

The phase change layer produces a difference in amount of current flowing in the phase change layer by using a change to a low-resistance crystalline state and a high-resistance amorphous state in which states electric resistance differs due to Joule heat generated by application of a voltage. Storage and readout are performed by obtaining information of "0" and "1" using the difference in the amount of current.

The storage element 20 (20F) is thus formed.

As in the first to third examples described above, in the storage element 20F, an electric field is easily concentrated on the variable-resistance layer 22 side of the first electrode 21. In addition, because the first electrode 21 is formed as a tubular object, it is possible to uniformly raise current density and concentrate an electric field at the entire region of a part of the first electrode 21 which part is in contact with the variable-resistance layer 22. Therefore, characteristic variations due to electric field concentration at angular parts of the electrode as in the techniques in the past can be eliminated.

There is thus an advantage of being able to perform stable data rewriting and achieve performance improvement in rewriting speed.

In addition, as in the first to third examples described above, heat generated in the variable-resistance layer 22 is radiated to the lower part of the first electrode 21 more easily. That is, the first electrode 21 increases in heat capacity from the variable-resistance layer 22 side to the third electrode 31 side. Therefore, a heat radiating property is improved. In addition, as in the first to third examples described above, the heat of the first electrode 21 is allowed to escape to the third electrode 31 side easily. That is, the heat radiating property is enhanced.

Accordingly, because the heat generated in the variable-resistance layer 22 is radiated to the lower part side of the first electrode 21, element degradation due to heat can be suppressed. Thus, there is an advantage of being able to improve the number of times of rewriting and data retention reliability.

2. Second Embodiment

First Example of Method of Manufacturing Storage Element

A first example of a method of manufacturing a storage element according to a second embodiment of the present invention will be described with reference to schematic configuration sectional views of FIGS. 5A to 5G. The manufacturing method in the first example is an example of a manufacturing method for forming the storage element 20A described with reference to the foregoing FIG. 1.

Figure 5A:
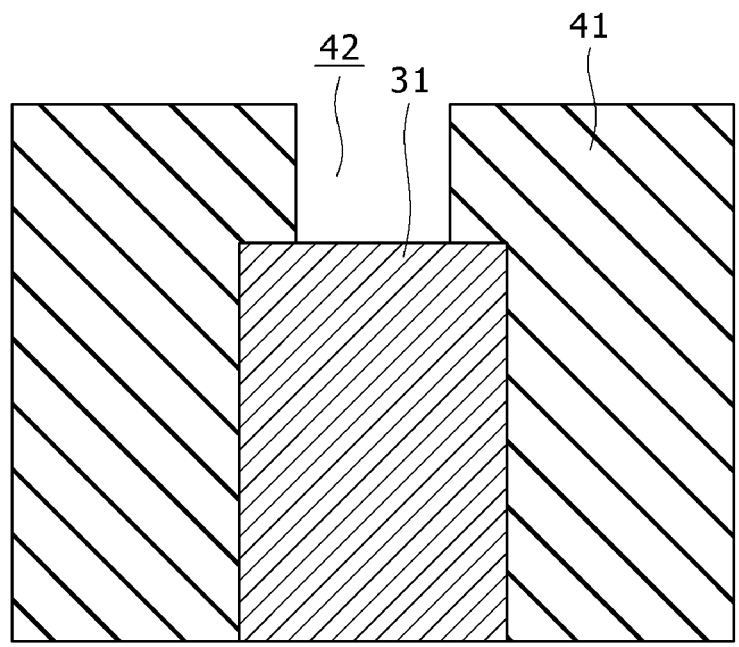
FIGS. 5A to 5G are manufacturing process sectional views of a first example of a method of manufacturing a storage element according to a second embodiment of the present invention.

As shown in FIG. 5A, a third electrode 31 is formed in an interlayer insulating film 41 on a substrate (not shown), and thereafter the interlayer insulating film 41 is further deposited to cover the third electrode 31. Thus, the interlayer insulating film 41 having the third electrode 31 formed in the film is formed. Then, though not shown, an etching mask is formed by resist coating, lithography techniques and the like, and a hole 42 reaching the third electrode 31 is formed in the interlayer insulating film 41 by etching using the etching mask. The hole 42 is most desirably formed in a circular cross-sectional shape, or may be formed in an elliptical cross-sectional shape. Alternatively, the hole 42 may be a polygon rounded so as to prevent concentration of an electric field at angular parts.

Thereafter, the etching mask is removed.

Figure 5B:
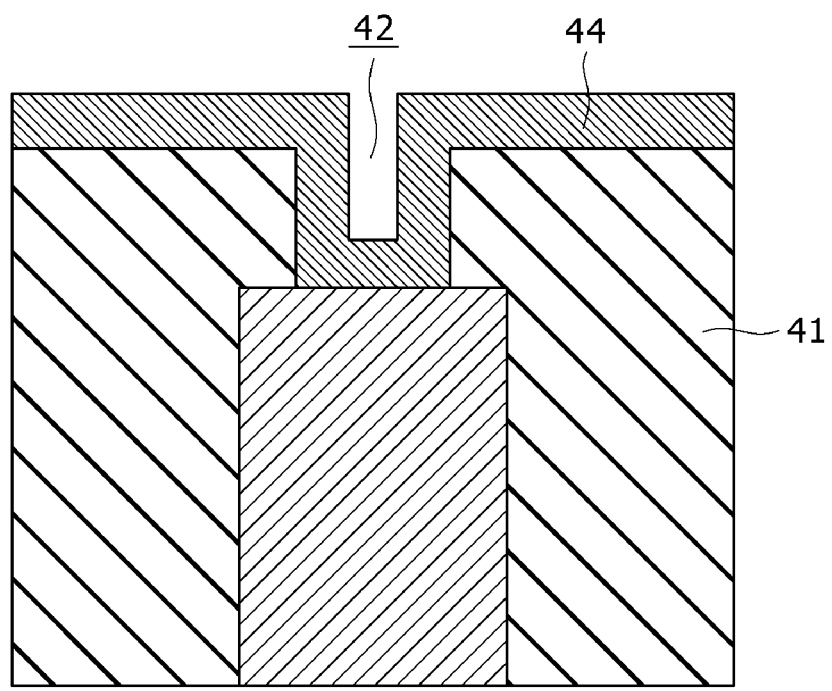

Next, as shown in FIG. 5B, an electrode forming film 44 is formed on the inner surface of the hole 42 and the surface of the interlayer insulating film 41. This electrode forming film 44 is for example formed of a wiring material used in a semiconductor process, for example titanium, titanium nitride, tungsten, tungsten nitride, or copper, or a silicon base semiconductor material. Alternatively, aluminum, molybdenum, tantalum nitride tantalum, metal silicide or the like can be used. The silicon base semiconductor material includes single crystal silicon, polycrystalline silicon, amorphous silicon and the like. In addition, these silicon materials may include a conductive impurity such as arsenic, phosphorus, antimony, boron, indium or the like.

Figure 5C:
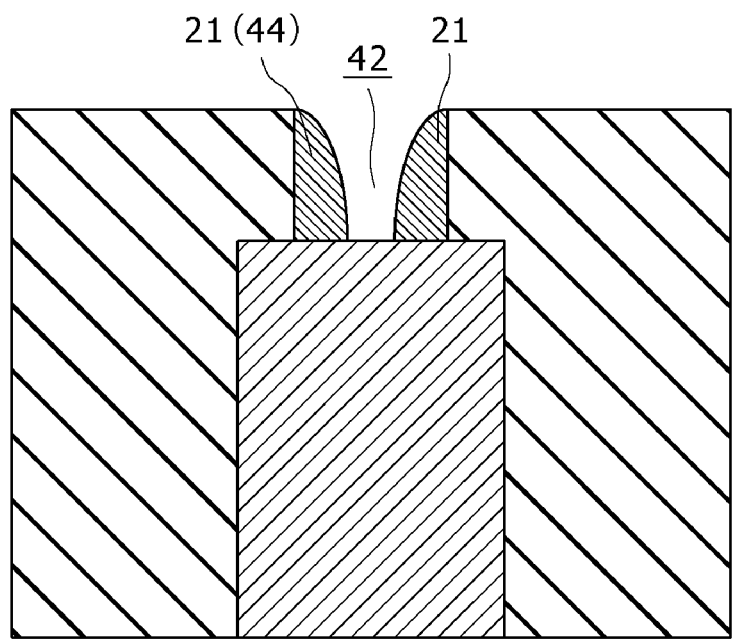

Next, as shown in FIG. 5C, a first electrode 21 is formed by etching back the electrode forming film 44 and leaving the electrode forming film 44 on the side wall of the hole 42 such that the electrode forming film 44 is thicker on the side of the bottom part of the hole 42 than on the side of the opening part of the hole 42. That is, the first electrode 21 is formed by the electrode forming film 44 left on the side wall of the hole 42. Thus, the first electrode 21 is formed in a so-called side wall shape on the side wall of the hole 42, and is formed in a circular ring shape as viewed in a plan view when the external shape in a cross section of the hole 42 is a circular shape. The first electrode 21 may be formed in an elliptical ring shape depending on the cross-sectional shape of the hole 42. In addition, even when the first electrode 21 is a polygon, it suffices to have angular parts of the polygon rounded so as to prevent concentration of an electric field at the angular parts.

Figure 5D:
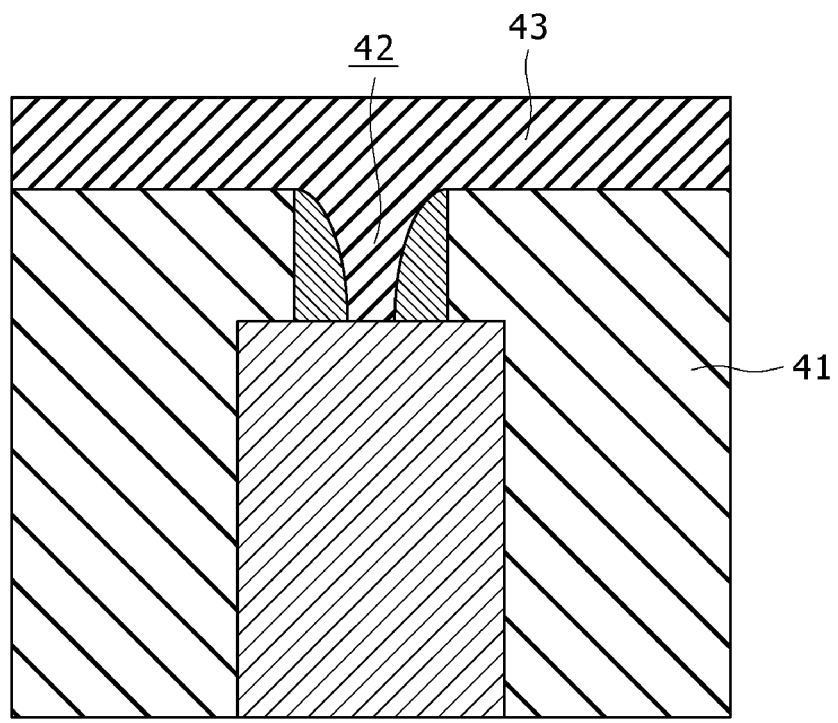

Next, as shown in FIG. 5D, an insulating film 43 is embedded in the hole 42. For example, an insulating material used for an ordinary interlayer insulating film such as a silicon oxide film, a low dielectric constant film or the like is embedded in the hole 42 by a chemical vapor deposition method, a coating method and the like. At this time, the insulating film 43 is also formed on the interlayer insulating film 41.

Figure 5E:
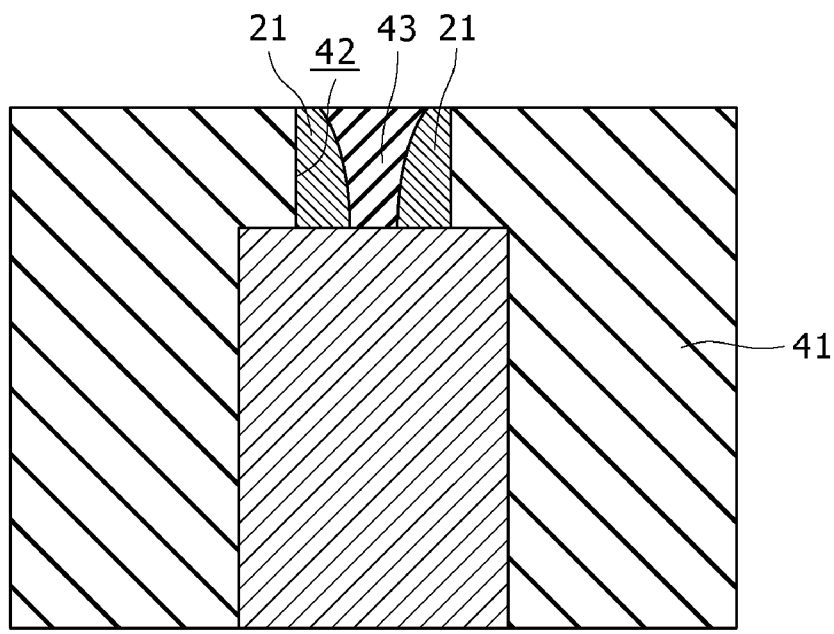

Next, as shown in FIG. 5E, an excess of the insulating film 43 on the interlayer insulating film 41 is removed and the insulating film 43 is left in the hole 42 by chemical mechanical polishing or etchback. At this time, the surface of the interlayer insulating film 41, the surface of the first electrode 21, and the surface of the insulating film 43 may be formed in an identical plane.

Figure 5F:
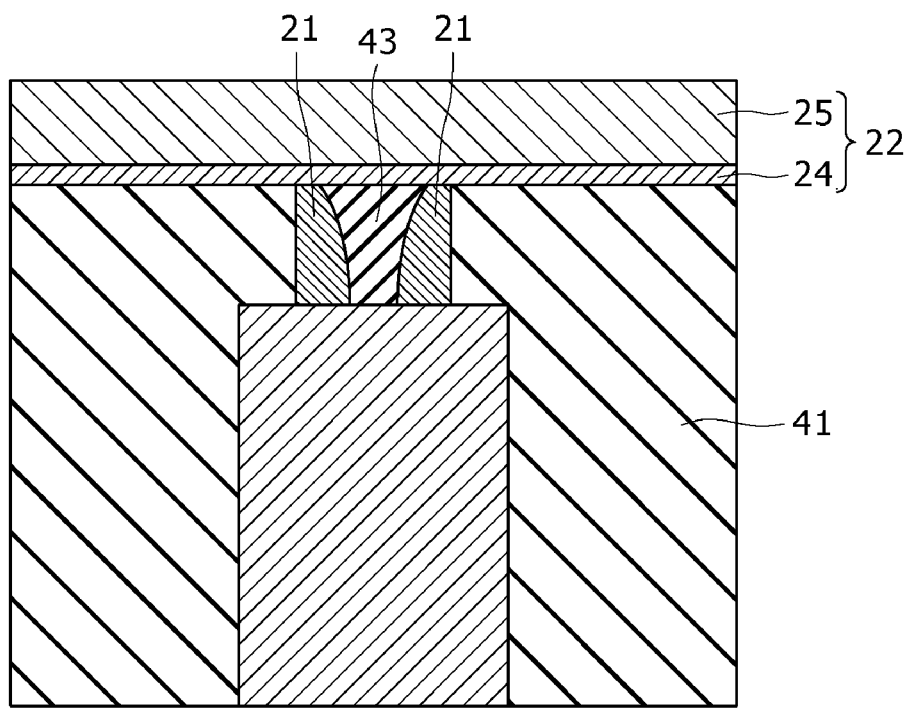

Next, as shown in FIG. 5F, a variable-resistance layer 22 to be connected to the upper part of the first electrode is formed on the interlayer insulating film 41 and the insulating film 43. As the variable-resistance layer 22, for example, a storage layer 24 made of a metallic oxide is formed on the side of the first electrode 21, and thereafter an ion source layer 25 supplying metal ions to the storage layer 24 or receiving metal ions supplied to the storage layer 24 is formed on the storage layer 24.

The storage layer 24 is formed by one of gadolinium oxide, tantalum oxide, niobium oxide, aluminum oxide, hafnium oxide, zirconium oxide, and mixed materials thereof.

The ion source layer 25 is formed by a film including one element selected from copper, silver, and zinc and one element selected from chalcogenide elements of tellurium, sulfur, and selenium. For example, a film of CuTe, GeSbTe, CuGeTe, AgGeTe, AgTe, ZnTe, ZnGeTe, CuS, CuGeS, CuSe, CuGeSe or the like is formed.

Figure 5G:
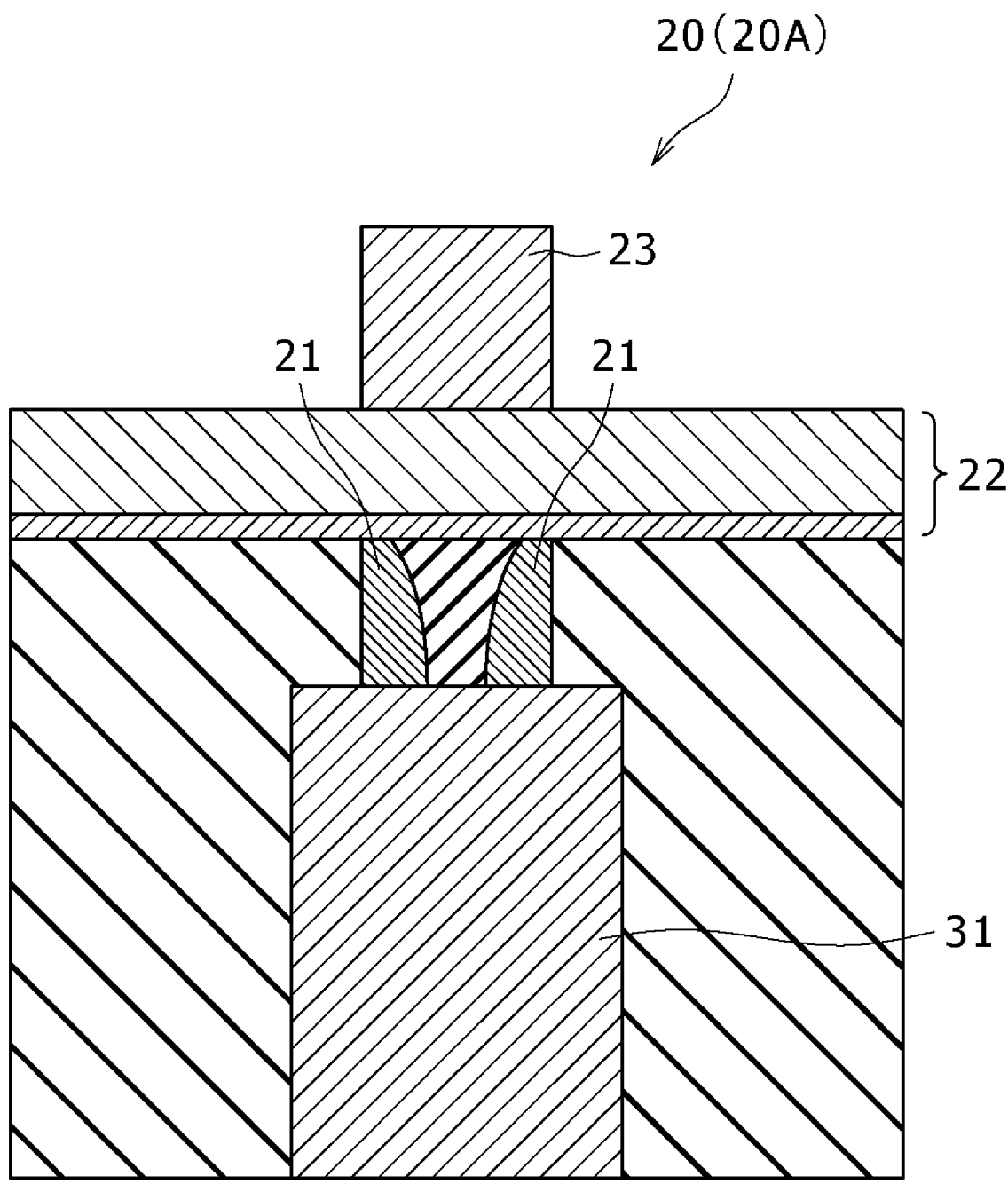

Next, as shown in FIG. 5G, a second electrode 23 is formed on the variable-resistance layer 22. This second electrode 23 is formed by using for example tungsten nitride, titanium nitride, tungsten, titanium, gold, platinum, silver, ruthenium, tellurium or the like. A method of forming the second electrode 23 is for example a deposition method and a lift-off method. Alternatively, the second electrode 23 may be a plate type formed over the entire surface.

The second electrode 23 may be of an electrode plug shape, of a wiring structure, or of a film structure as long as the second electrode 23 is electrically connected to the variable-resistance layer 22. In addition, the third electrode 31 may be of an electrode plug shape, of a wiring structure, or a diffusion layer formed in a silicon substrate or the like, for example, as long as the third electrode 31 is electrically connected to the lower surface side of the first electrode 21.

The storage element 20 (20A) is thus formed.

In the manufacturing method in the first example described above, the first electrode 21 is formed by a tubular object, and is formed so as to be thinner on the variable-resistance layer 22 side than on the opposite side from the variable-resistance layer 22. Thus, an electric field is easily concentrated on the variable-resistance layer 22 side of the first electrode 21. In addition, because the first electrode 21 is formed as a tubular object, it is possible to uniformly raise current density and concentrate an electric field at the entire region of a part of the first electrode 21 which part is in contact with the variable-resistance layer 22. Therefore, characteristic variations due to electric field concentration at angular parts of the electrode as in the techniques in the past can be eliminated.

There is thus an advantage of being able to perform stable data rewriting and achieve performance improvement in rewriting speed.

In addition, because the opposite side from the variable-resistance layer 22 is formed so as to be thicker than the variable-resistance layer 22 side, heat generated in the variable-resistance layer 22 is easily radiated to the lower part of the first electrode 21. That is, the first electrode 21 increases in sectional area from the variable-resistance layer 22 side to the third electrode 31 side, and thus increases in heat capacity from the variable-resistance layer 22 side to the third electrode 31 side. Therefore, a heat radiating property is improved. In addition, because the third electrode 31 is formed such that the area of the upper surface of the third electrode 31 on the side in contact with the first electrode 21 is equal to or more than the area of the bottom part of the first electrode 21, the heat of the first electrode 21 is allowed to escape to the third electrode 31 side easily. That is, the heat radiating property is further enhanced.

Accordingly, element degradation due to heat generated in the variable-resistance layer 22 can be suppressed. Thus, there is an advantage of being able to improve the number of times of rewriting and data retention reliability.

In addition, because the interlayer insulating film 41 and the insulating film 43 are formed on the inside and the side peripheral part of the first electrode 21, and the upper surface of the insulating film 43, the upper surface of the first electrode 21, and the upper surface of the interlayer insulating film 41 are formed in an identical plane, an area of contact between the upper part of the first electrode 21 and the variable-resistance layer 22 is reduced. Thus, it is possible to raise current density and concentrate an electric field at the upper part (variable-resistance layer 22 side) of the first electrode 21, and contribute to improvement in rewriting performance and stability of characteristic variations.

Second Example of Method of Manufacturing Storage Element

A second example of a method of manufacturing a storage element according to the second embodiment of the present invention will be described with reference to a schematic configuration sectional view of FIGS. 6A and 6B. The manufacturing method in the second example is an example of a manufacturing method for forming the storage element 20B described with reference to the foregoing FIG. 2.

Figure 6A:
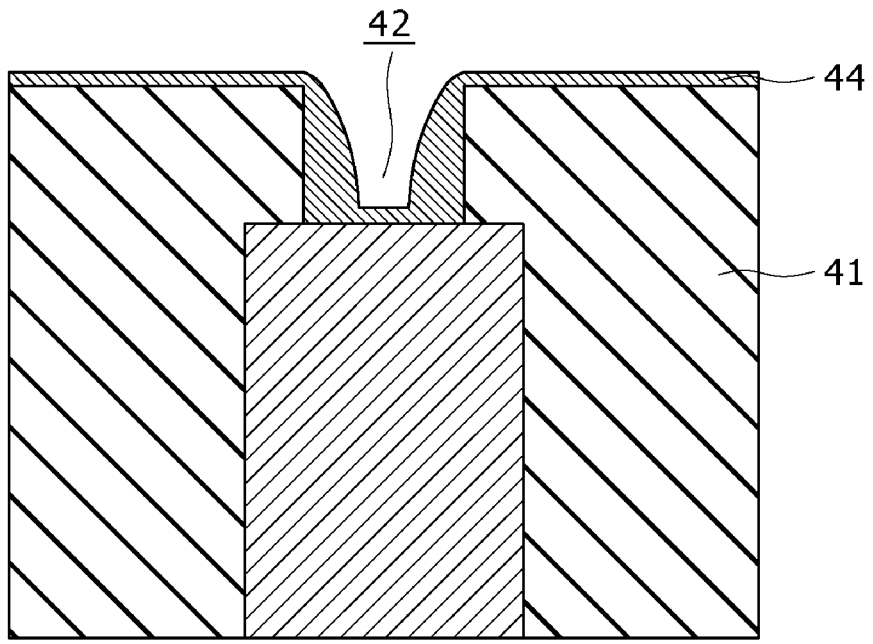
FIGS. 6A and 6B are manufacturing process sectional views of a second example of the method of manufacturing the storage element according to the second embodiment.

As shown in FIG. 6A, when the electrode forming film 44 described with reference to the foregoing FIG. 5C for the manufacturing method in the foregoing first example is etched back, the etchback is stopped in a state in which the electrode forming film 44 is left in the bottom part of the hole 42. At this time, the electrode forming film 44 is also left on the interlayer insulating film 41.

Figure 6B:
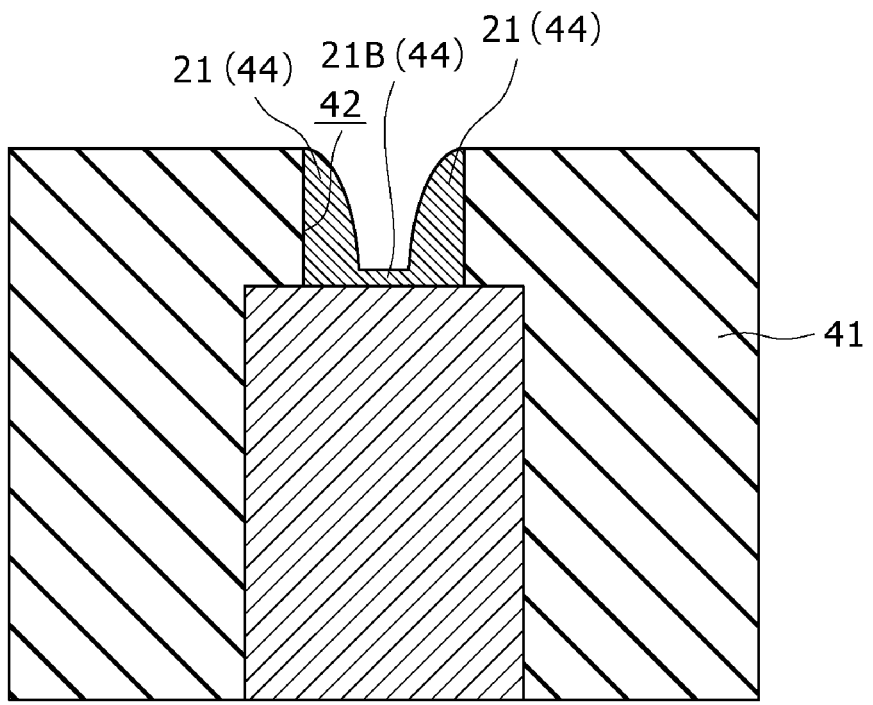

Next, as shown in FIG. 6B, the electrode forming film 44 on the interlayer insulating film 41 is removed by chemical mechanical polishing, for example. As a result, the first electrode 21 is formed on the side wall part of the hole 42, and a bottom part electrode 21B is formed on the bottom side of the hole 42. The first electrode 21 and the bottom part electrode 21B are formed integrally with each other by the identical material of the electrode forming film 44.

Thereafter, though not shown, as in the manufacturing method in the foregoing first example, an insulating film 43 is embedded in the hole 42, and further a variable-resistance layer 22 and a second electrode 23 are formed.

The second example of the manufacturing method provides action and effects similar to those of the first example of the manufacturing method. In addition, because the first electrode 21 is formed so as to be thicker on the opposite side from the variable-resistance layer 22 than on the variable-resistance layer 22 side, and further the bottom part electrode 21B is formed, heat generated in the variable-resistance layer 22 is radiated from the lower part of the first electrode 21 more easily.

Accordingly, because the heat generated in the variable-resistance layer 22 is radiated to the lower part side of the first electrode 21, element degradation due to heat can be suppressed. Thus, there is an advantage of being able to improve the number of times of rewriting and data retention reliability.

Third Example of Method of Manufacturing Storage Element

A third example of a method of manufacturing a storage element according to the second embodiment of the present invention will be described with reference to a schematic configuration sectional view of FIGS. 7A and 7B. The manufacturing method in the third example is an example of a manufacturing method for forming the storage element 20C described with reference to the foregoing FIG. 3.

Figure 7A:
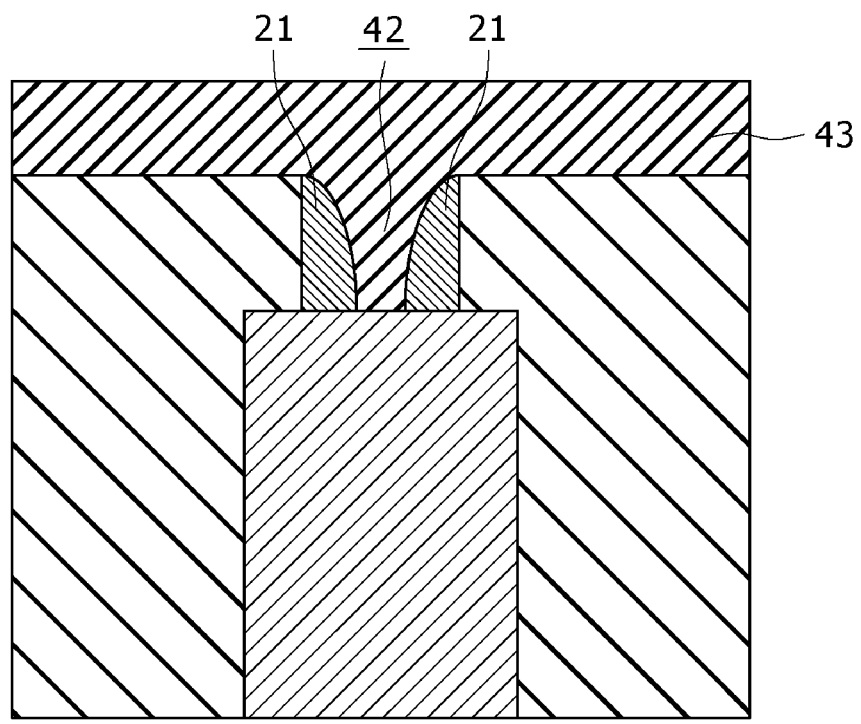
FIGS. 7A and 7B are manufacturing process sectional views of a third example of the method of manufacturing the storage element according to the second embodiment.

As shown in FIG. 7A, as described with reference to the foregoing FIG. 5D for the manufacturing method in the foregoing first example, an insulating film 43 is embedded in a hole 42 in which a first electrode 21 is formed.

Figure 7B:
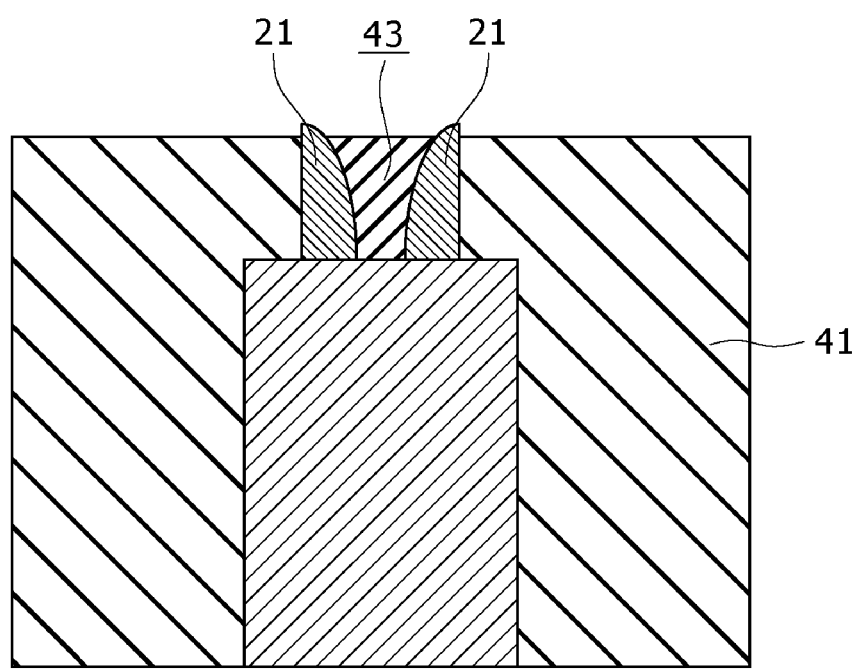

Next, as shown in FIG. 7B, the insulating film 43 on an interlayer insulating film 41 is removed to expose the tip part of the first electrode 21. Further, the upper parts of the interlayer insulating film 41 and the insulating film 43 are removed to project the tip part of the first electrode 21 from the surfaces of the interlayer insulating film 41 and the insulating film 43.

For example, the interlayer insulating film 41 and the insulating film 43 are selectively etched by isotropic wet etching, anisotropic dry etching or the like that selectively etches the interlayer insulating film 41 and the insulating film 43 as opposed to the first electrode 21. When the interlayer insulating film 41 and the insulating film 43 are formed by a silicon oxide film, wet etching with a hydrofluoric acid is used. Thus, the insulating film 43 is desirably formed by a film having an etching rate equal to that of the interlayer insulating film 41, for example a film of the same kind as the interlayer insulating film 41.

Thereafter, though not shown, as in the manufacturing method in the foregoing first example, a variable-resistance layer 22 and a second electrode 23 are formed.

The third example of the manufacturing method provides action and effects similar to those of the first example of the manufacturing method. In addition, the upper surface of the insulating film 43 and the upper surface of the interlayer insulating film 41 are formed in an identical plane, and the first electrode 21 is formed in a state of projecting from the identical plane. Thereby, an area of contact between the upper part of the first electrode 21 and the variable-resistance layer 22 is somewhat increased, but an electric field is concentrated at the upper end part of the first electrode 21 more easily. It is thus possible to contribute to improvement in rewriting performance and stability of characteristic variations.

3. Third Embodiment

One Example of Configuration of Semiconductor Storage Device

An example of configuration of a semiconductor storage device according to a third embodiment of the present invention will be described with reference to a schematic configuration sectional view of FIG. 8 and a circuit diagram of FIG. 9.

Figure 8:
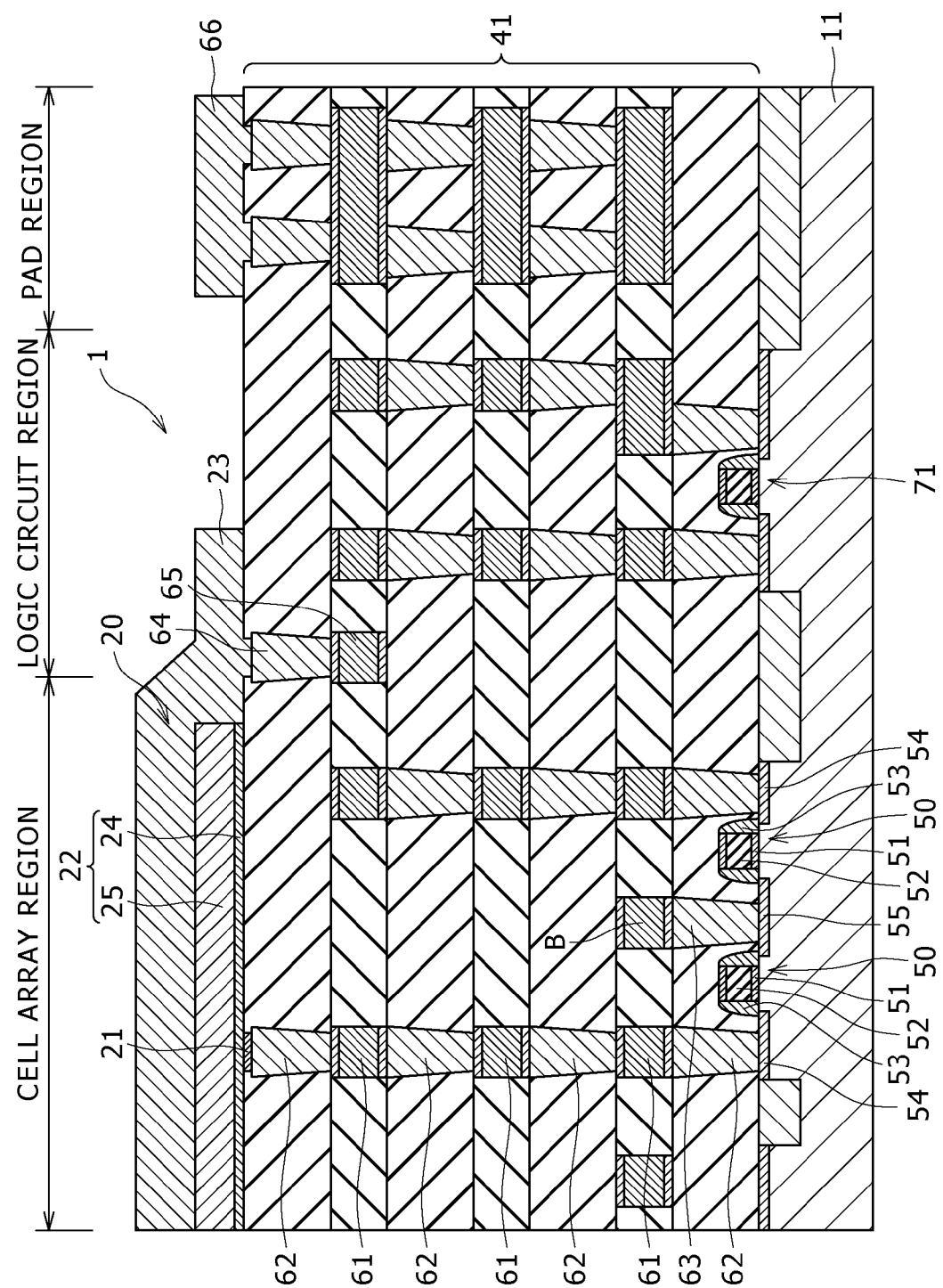
FIG. 8 is a schematic configuration sectional view of an example of a semiconductor storage device according to a third embodiment.

As shown in FIG. 8, a select transistor 50 is formed on a semiconductor substrate 11. The select transistor 50 has a gate electrode 52 on the semiconductor substrate 11 with a gate insulating film 51 interposed between the semiconductor substrate 11 and the gate electrode 52. A word line W (not shown) is connected to the gate electrode 52. In addition, side walls 53 are formed on both sides of the gate electrode 52.

Diffusion layers 54 and 55 serving as a source and a drain are formed in the semiconductor substrate 11 on both sides of the gate electrode 52. One diffusion layer 54 is for example connected with a first electrode 21 of a storage element 20 by a plurality of layers (three layers in the drawing) of wiring 61, plugs 62 connected to each piece of wiring 61, and the like. Similarly, the other diffusion layer 55 is also connected to the storage element 20 through another path. In addition, the other diffusion layer 55 is connected to a bit line B by a plug 63.

The storage element 20 has the first electrode 21 connected to an uppermost part of the wiring 61 and the plugs 62 connected to the diffusion layer 54. A variable-resistance layer 22 (for example a storage layer 24 and an ion source layer 25) is a plate type formed over substantially the whole of a cell array region. A second electrode 23 connected to the variable-resistance layer 22 is formed over the entire surface of the variable-resistance layer 22, and is connected to wiring (plate wiring) 65 via a plug 64 formed in an interlayer insulating film 41.

In addition, a transistor 71 of a logic circuit section is formed on the semiconductor substrate 11. In addition, a pad electrode 66 connected to a predetermined wiring layer is formed on the interlayer insulating film 41 on the semiconductor substrate 11 in a pad section.

An example of circuit configuration of the semiconductor storage device 1 of the above-described structure will be described with reference to the circuit diagram of FIG. 9.

Figure 9:
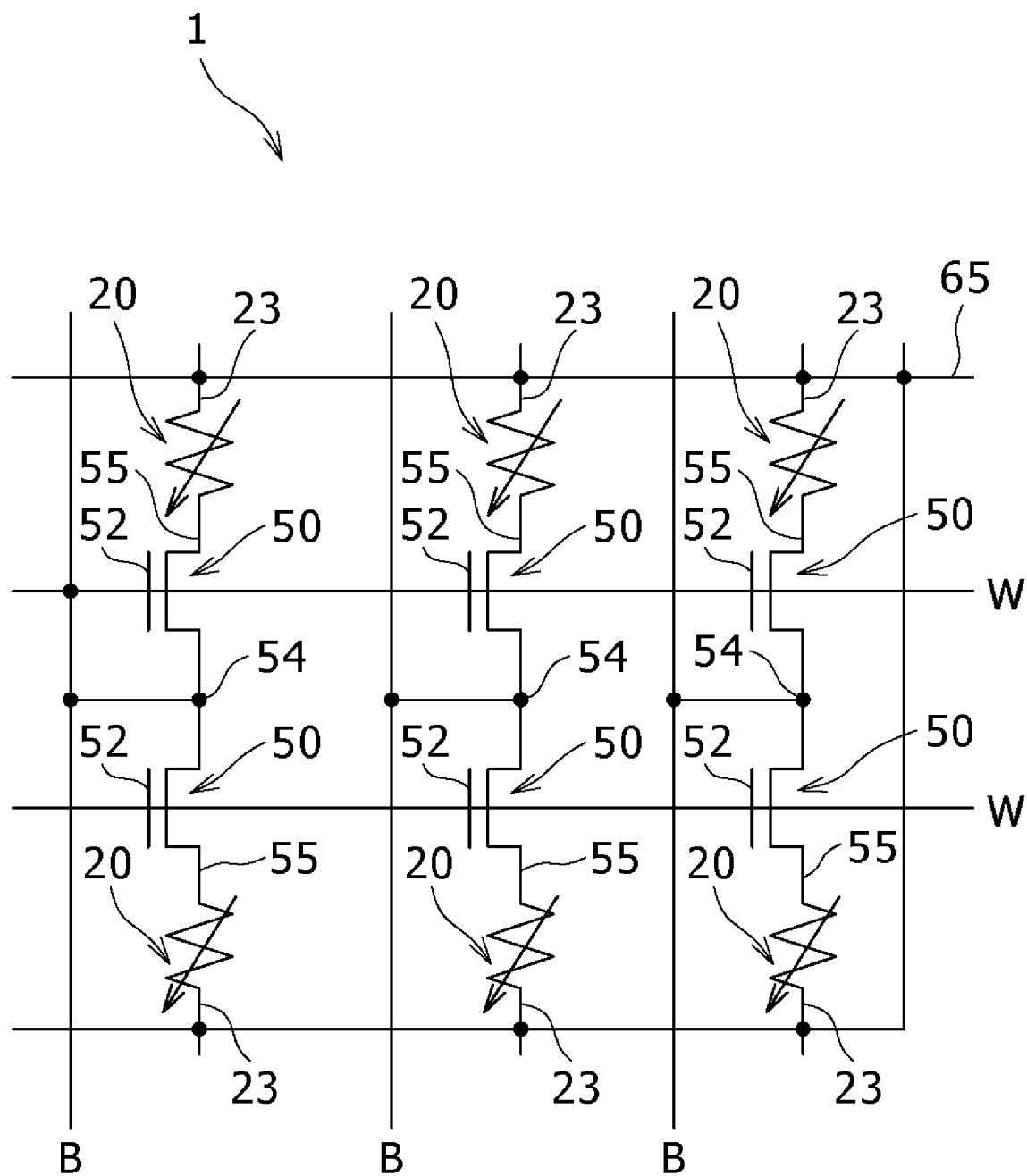
FIG. 9 is a circuit diagram showing an example of the semiconductor storage device according to the third embodiment of the present invention.

As shown in FIG. 9, the first electrode 21 side of a storage element 20 according to one embodiment of the present invention described above is connected to one diffusion layer 54 of a select transistor 50, and a bit line B is connected to the other diffusion layer 55 of the select transistor 50. One select transistor 50 and one storage element 20 thus form one memory cell M. A plurality of such memory cells M are arranged in the form of a matrix, for example. In this example, the diffusion layer 55 of the select transistor 50 to which layer the bit line B is connected is shared with an adjacent select transistor 50. The second electrode 23 side of the storage element 20 may be formed by one plate electrode, for example. A word line W is connected to the gate electrode 52 of each select transistor 50. In this example, word lines W and bit lines B are arranged so as to be orthogonal to each other at predetermined intervals in circuit layout.

The above-described example is an example of a semiconductor storage device of a plate type, and is similarly applicable to storage elements of semiconductor storage devices of a cross-point type, for example.

The semiconductor storage device 1 described above uses storage elements 20 according to one embodiment of the present invention. Therefore, rewriting is stable, and rewriting speed is improved. Thus, because rewriting is stable and rewriting speed is improved, there is an advantage of being able to improve reliability and improve operating speed.

The present application contains subject matter related to that disclosed in Japanese Priority Patent Application JP 2009-089788 filed in the Japan Patent Office on Apr. 2, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A storage element comprising:
   a first electrode;
   a second electrode positioned opposed to said first electrode; and
   a variable-resistance layer interposed between said first electrode and said second electrode,
   wherein,
      said first electrode is a tubular in shape about an axis extending through the first and second electrodes, and has a wall that is thicker at a first side facing away from said variable-resistance layer than at a second side facing toward said variable-resistance layer.

2. The storage element according to claim 1, wherein said first electrode wall becomes gradually thicker from the second side to the first side.

3. The storage element according to claim 1, wherein said first electrode has a bottom part electrode connected to the first side of said first electrode.

4. The storage element according to claim 1, comprising a third electrode in the interlayer insulating layer that is connected to the first side said first electrode.

5. The storage element according to claim 4, wherein an area of an upper surface of said third electrode that is in contact with the first side of said first electrode is equal to or more than an area of the first side of said first electrode.

6. The storage element according to claim 1, comprising an insulating film on an inside and a side peripheral part of said first electrode, wherein a surface of said insulating film and a surface of said first electrode are formed in an identical plane.

7. The storage element according to claim 1, comprising an insulating film on an inside and a side peripheral part of said first electrode, and an upper part of said first electrode is formed so as to project from a surface of said insulating film.

8. The storage element according to claim 1, wherein said first electrode is formed of one of titanium, titanium nitride, tungsten, tungsten nitride, copper, and a silicon base semiconductor material.

9. The storage element according to claim 1, wherein
   (a) said variable-resistance layer includes
      (1) a storage layer formed adjacent the second side of said first electrode, and
      (2) an ion source layer adjacent a side of said second electrode facing the first electrode, the ion source layer supplying metal ions to said storage layer or receiving metal ions supplied to said storage layer, and
   (b) said ion source layer having one element selected from copper, silver, and zinc and one element selected from tellurium, sulfur, and selenium.

10. The storage element according to claim 9, wherein said storage layer is formed of one of gadolinium oxide, tantalum oxide, niobium oxide, aluminum oxide, hafnium oxide, zirconium oxide, and mixed materials of gadolinium oxide, tantalum oxide, niobium oxide, aluminum oxide, hafnium oxide, and zirconium oxide.

11. The storage element according to claim 1, wherein said variable-resistance layer is a solid electrolyte membrane.

12. The storage element according to claim 1, wherein said variable-resistance layer is a metallic oxide film.

13. A method of manufacturing a storage element, said method comprising:
   forming a hole reaching a third electrode in an interlayer insulating film having said third electrode formed in the film;
   forming an electrode forming film on an inner surface of said hole and a surface of said interlayer insulating film;
   forming a first electrode by etching back said electrode forming film and leaving said electrode forming film on a side wall of said hole such that said electrode forming film has a tubular wall that is thicker at a side at a bottom part of said hole than at a side at an opening part of said hole;

embedding an insulating film in said hole;

forming a variable-resistance layer connected to an upper part of said first electrode on said interlayer insulating film; and forming a second electrode on said variable-resistance layer.

14. The method of manufacturing the storage element according to claim 13, wherein:

when said electrode forming film is etched back, the etch-back is stopped in a state in which said electrode forming film is left in the bottom part of said hole, and said electrode forming film on said interlayer insulating film is removed by chemical mechanical polishing.

15. The method of manufacturing the storage element according to claim 13, further comprising:

causing a tip part of said first electrode to project from surfaces of said interlayer insulating film and said insulating film by removing upper parts of said interlayer insulating film and said insulating film after the step of embedding said insulating film.

16. A semiconductor storage device comprising:

a select transistor composed of an insulated gate field effect transistor formed on a semiconductor substrate;

an interlayer insulating film covering said select transistor formed on said semiconductor substrate; and a storage element formed on said interlayer insulating film; wherein, (a) said storage element includes
  (1) a first electrode on said interlayer insulating film,
  (2) a second electrode positioned opposed to said first electrode, and
  (3) a variable-resistance layer interposed between said first electrode and said second electrode, (b) said first electrode tubular about an axis extending through the first and second electrodes and has a wall that is thicker at a first side facing away from said variable-resistance layer than at a second side facing toward said variable-resistance layer, and (c) one of diffusion layers formed in said semiconductor substrate on both sides of a gate electrode of said select transistor is connected to said first electrode.

* * * * *